US009835499B2

(12) United States Patent
Arisaka et al.

(10) Patent No.: US 9,835,499 B2
(45) Date of Patent: Dec. 5, 2017

(54) SEMICONDUCTOR DEVICE

(71) Applicant: Renesas Electronics Corporation, Tokyo (JP)

(72) Inventors: Naoya Arisaka, Tokyo (JP); Masataka Minami, Tokyo (JP); Takahiro Miki, Tokyo (JP)

(73) Assignee: Renesas Electronics Corporation, Tokyo (JP)

( * ) Notice: Subject to any disclaimer, the term of this patent is extended or adjusted under 35 U.S.C. 154(b) by 231 days.

(21) Appl. No.: 14/928,856

(22) Filed: Oct. 30, 2015

(65) Prior Publication Data

US 2016/0187204 A1     Jun. 30, 2016

(30) Foreign Application Priority Data

Dec. 25, 2014    (JP) ................................. 2014-263367

(51) Int. Cl.
     *G01K 7/01*      (2006.01)
     *H03K 21/00*      (2006.01)
     *H03K 21/38*      (2006.01)

(52) U.S. Cl.
     CPC ............... *G01K 7/01* (2013.01); *H03K 21/00* (2013.01); *H03K 21/38* (2013.01); *G01K 2217/00* (2013.01); *G01K 2219/00* (2013.01)

(58) Field of Classification Search
     CPC .......... H03K 21/00; H03K 21/38; G01K 7/01; G01K 2217/00; G01K 2219/00
     See application file for complete search history.

(56) References Cited

U.S. PATENT DOCUMENTS

| 4,480,312 | A | * | 10/1984 | Wingate | G01D 5/248 374/167 |
| 6,806,698 | B2 | * | 10/2004 | Gauthier | G01K 7/01 324/76.41 |
| 6,893,154 | B2 | | 5/2005 | Gold et al. | |
| 7,283,007 | B2 | * | 10/2007 | Duval | G01K 7/01 331/158 |
| 8,136,987 | B2 | | 3/2012 | Luria et al. | |
| 2008/0238563 | A1 | | 10/2008 | Kim et al. | |
| 2016/0061667 | A1 | * | 3/2016 | Hwang | G01K 7/00 374/183 |

FOREIGN PATENT DOCUMENTS

| JP | 2001-251189 A | 9/2001 |
| JP | 2008-256694 A | 10/2008 |

* cited by examiner

*Primary Examiner* — Patrick O'Neill
(74) *Attorney, Agent, or Firm* — McGinn IP Law Group, PLLC

(57) ABSTRACT

The present invention provides a semiconductor device having a sensor capable of improving precision while suppressing increase in occupation area. A semiconductor device has: a first counter; and a second counter (time measuring circuit) measuring time until a count value, which is obtained by counting a first signal having a frequency corresponding to a first voltage, reaches a largest count value which can be counted by the first counter. The first counter obtains a piece of digital information corresponding to the first voltage on the basis of a count value obtained by counting a second signal having a frequency corresponding to a second voltage, which is different from the first voltage, on the basis of the time measured by the time measuring circuit.

6 Claims, 9 Drawing Sheets

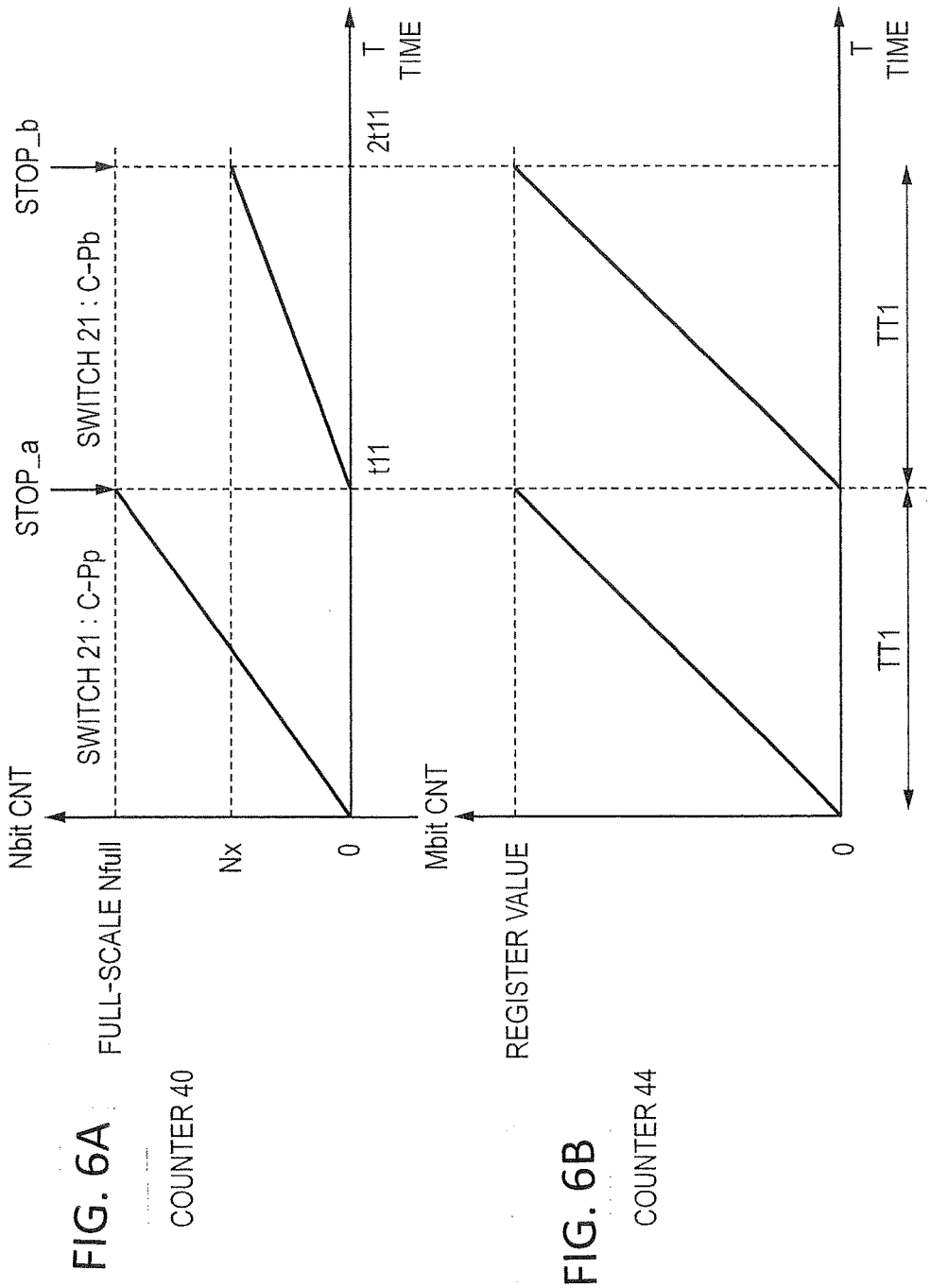

SEMICONDUCTOR DEVICE

CROSS-REFERENCE TO RELATED APPLICATIONS

The disclosure of Japanese Patent Application No. 2014-263367 filed on Dec. 25, 2014 including the specification, drawings and abstract is incorporated herein by reference in its entirety.

BACKGROUND

The present invention relates to a semiconductor device and, particularly, relates to a semiconductor device having therein a sensor.

A sensor is generally provided in a semiconductor device. An example of the sensor is a temperature sensor sensing the temperature on the inside of the semiconductor device. By grasping the temperature in the semiconductor device by the built-in temperature sensor, for example, operation speed of a circuit block in the semiconductor device is controlled. It can suppress a situation such that operation of the semiconductor device becomes unstable due to rise in the temperature of the semiconductor device.

The temperature sensor is disclosed in, for example, patent literatures 1 to 4.

RELATED ART LITERATURE

Patent Literature

Patent Literature 1: Japanese Unexamined Patent Application Publication No. 2001-251189
Patent Literature 2: Japanese Unexamined Patent Application Publication No 2008-256694
Patent Literature 3: U.S. Pat. No. 6,893,154
Patent Literature 4: U.S. Pat. No. 8,136,987

SUMMARY

In the case of providing a temperature sensor in a semiconductor device, it is desirable to make the area occupied by the temperature sensor in a semiconductor chip small. The reason is that, for example, when the area occupied by the temperature sensor is large, the size of the semiconductor chip becomes larger by the amount, and it causes rise in the price of a semiconductor device. Consequently, miniaturization of a temperature sensor is in demand.

In the case of controlling a circuit block in a semiconductor device on the basis of temperature, the temperature in the semiconductor as an object of a temperature sensor changes linearly. To control the circuit block, a piece of digital information is used as an output of the temperature sensor. For this purpose, the temperature sensor has an analog/digital converting (hereinbelow, also called AD conversion) circuit. In this case, the resolution of the temperature sensor is a temperature step (temperature change range) expressed by the least significant bit of the piece of digital information output from the AD converting circuit. The temperature can be also expressed by some of bits (for example, a few bits from the least significant bit toward the most significant bit) in the piece of digital information output from the AD converting circuit. However, by expressing the temperature by many bits, for example, all of the bits of the piece of digital information output from the AD converting circuit, the precision of the temperature sensor can be improved.

Although a temperature sensor is described in the patent literatures 1 to 4, a semiconductor device having a sensor capable of improving precision while suppressing increase in occupation area is not described.

An object of the present invention is to provide a semiconductor device having a sensor capable of improving precision while suppressing increase in occupation area.

The above and other objects of the present invention and novel features will become apparent from the description of the specification and the appended drawings.

SUMMARY

Representative outline of the inventions disclosed in the application will be briefly described as follows.

Time until a count value, which is obtained by counting a first signal having a frequency corresponding to a first voltage, reaches a largest count value which can be counted by a first counter is measured. After that, a piece of digital information corresponding to the first voltage on the basis of a count value obtained by counting a second signal having a frequency corresponding to a second voltage, which is different form the first voltage, on the basis of the time measured by the time measuring circuit. Consequently, the first voltage is expressed by a piece of analog information of the number of bits corresponding to the largest count value which can be counted by the first counter, and the precision can be improved.

An effect obtained by representative one of the inventions disclosed in the present application will be briefly described as follows.

A semiconductor device having a sensor capable of improving precision while suppressing increase in occupation area can be provided.

BRIEF DESCRIPTION OF THE DRAWINGS

FIGS. 6A and 6B are explanatory diagrams for explaining operations of counters.

DETAILED DESCRIPTION

Figure 1:
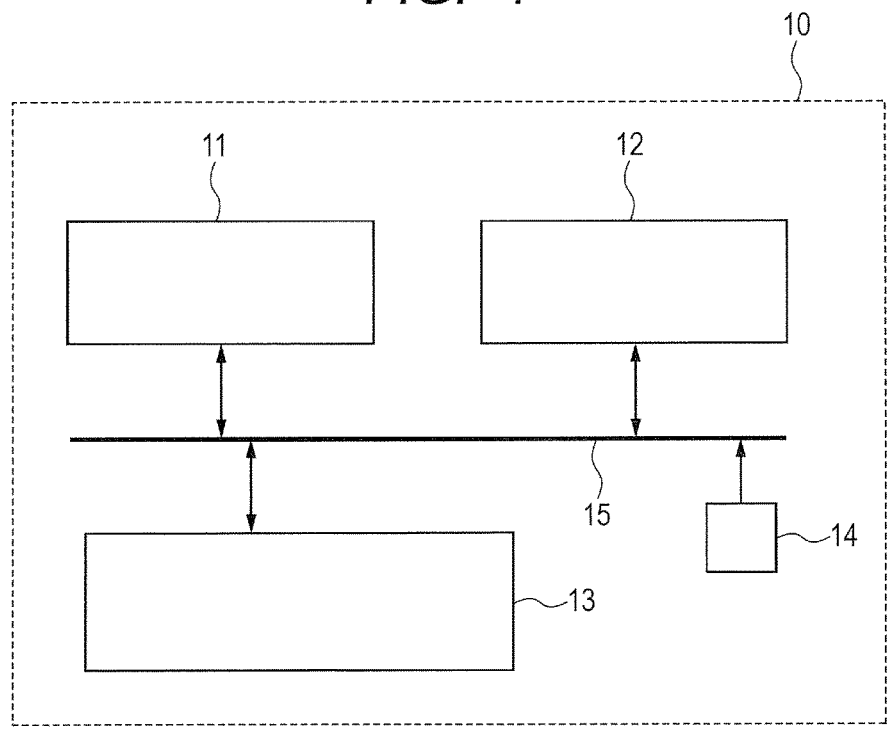
FIG. 1 is a block diagram illustrating the configuration of a semiconductor device according to an embodiment.

Hereinbelow, an embodiment of the present invention will be specifically described with reference to the drawings. In all of the drawings, as a general rule, the same reference numeral is designated to the same part and its repetitive description will not be given.

In the embodiment to be described below, a temperature sensor measuring temperature on the inside of a semiconductor device is employed as an example. The invention, however, is not limited to the temperature sensor.

Configuration of Semiconductor Device

FIG. 1 is a block diagram illustrating the configuration of a semiconductor device according to an embodiment. The diagram illustrates a semiconductor device 10, a microcontroller (hereinbelow, also called as MCU) 11, an analog circuit 12, a storing circuit 13, a temperature sensor 14, and a bus 15. Although not limited, those circuit blocks (11 to 14) and the bus 15 are formed on a single semiconductor chip by a known semiconductor manufacturing technique.

Although not illustrated, the storing circuit 13 has an electrically rewritable nonvolatile memory (hereinbelow, also called nonvolatile memory) and a volatile memory. In the nonvolatile memory, a program for controlling the MCU 11 is stored. The MCU 11 reads a program from the nonvolatile memory via the bus 15 and executes a predetermined operation in accordance with the read program. To the bus 15, the analog circuit 12 and the temperature sensor 14 are coupled. Although not limited, when the MCU 11 executes a predetermined process, a piece of information is input/output from/to the analog circuit 12 by using the bus 15. By the operation, a process using a piece of analog information is performed.

In the embodiment, a piece of digital information from the temperature sensor 14 is supplied to the MCU 11 and/or the storing circuit 13 via the bus 15. The temperature sensor 14 outputs the temperature in the semiconductor chip as a piece of digital information. The MCU 11 fetches the piece of digital information regarding the temperature from the temperature sensor 14, for example, in predetermined cycles and grasps the temperature of the semiconductor chip at that time on the basis of the fetched piece of digital information. The MCU 11 controls, for examples, the operation speed of the MCU 11 on the basis of the grasped temperature. When the grasped temperature exceeds predetermined temperature, the MCU 11 decreases frequency of an operation clock to be supplied to the MCU 11 to decrease the temperature of the semiconductor chip. As a result, the temperature of the semiconductor device 10 decreases.

The volatile memory included in the storing circuit 13 is used as a primary storing region, for example, when the MCU 11 performs a predetermined process.

Outline of Operations

Figure 9:
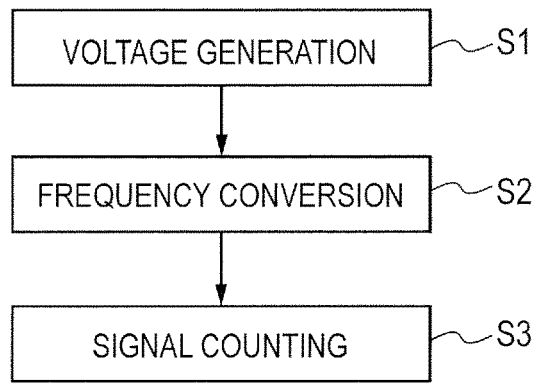
FIG. 9 is a flowchart illustrating general operations related to the embodiment.

First, outline of operations of obtaining a piece of digital information corresponding to temperature by using the temperature sensor 14 will be described with reference to FIG. 9. FIG. 9 is a flowchart at the time of converting temperature to a piece of digital information.

In the embodiment, a first voltage depending on temperature and a second voltage hardly depending on temperature are generated by a reference voltage circuit (step S1). The generated first and second voltages are frequency-converted by a voltage-frequency converting circuit to obtain a first signal having a frequency corresponding to the first voltage and a second signal having a frequency corresponding to the second voltage in step S2. Next, by counting the first and second signals in step S3, a piece of digital information corresponding to the first voltage is obtained.

Next, the configuration and operation of each of the components will be sequentially described.

Configuration of Temperature Sensor 14

Figure 2:
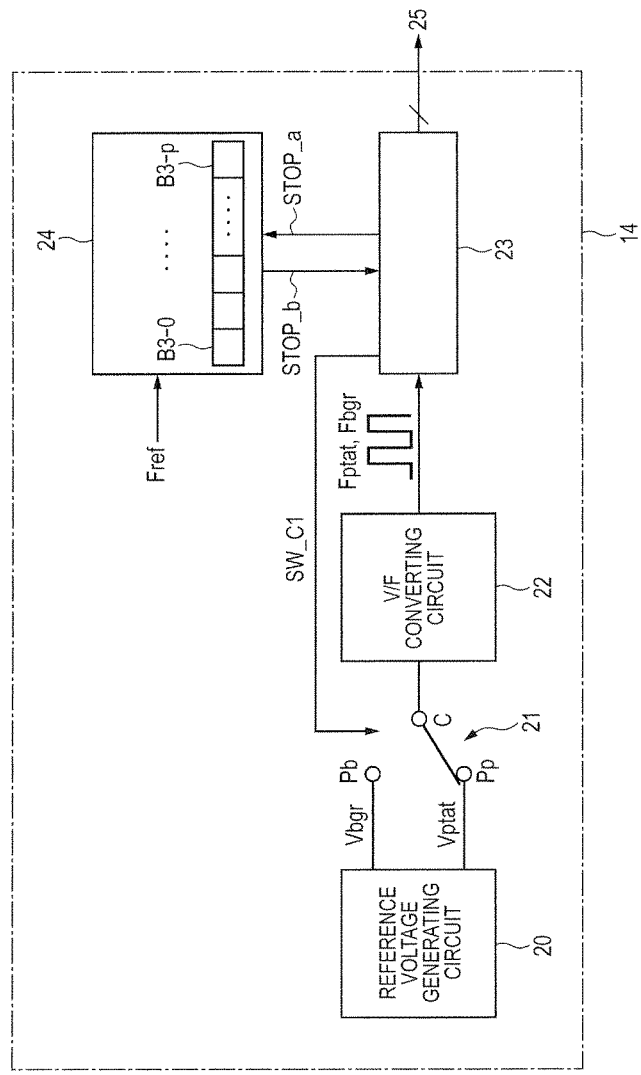
FIG. 2 is a block diagram illustrating the configuration of a temperature sensor according to the embodiment.

FIG. 2 is a block diagram illustrating the configuration of the temperature sensor 14 according to the embodiment. The temperature sensor 14 has a reference voltage generating circuit 20, a switch 21, a voltage-frequency converting circuit (hereinbelow, also called V/F converting circuit) 22, a first counter circuit 23, and a second counter circuit 24.

The reference voltage generating circuit 20 detects temperature Tj of the semiconductor chip (hereinbelow, also called chip temperature), generates a voltage Vbgr (second voltage) hardly depending on the chip temperature Tj and a voltage Vptat (first voltage) direct proportional to the chip temperature Tj, and outputs the voltages. That is, the reference voltage generating circuit 20 generates the voltage Vbgr whose voltage value hardly depends on a change in the chip temperature Tj and the voltage Vptat whose voltage value depends on the change in the chip temperature Tj as compared with the voltage Vbgr. In the embodiment, since the voltage Vptat depends in direct proportion to the chip temperature Tj, when the chip temperature Tj increases, the voltage value of the voltage Vptat also increases and, when the chip temperature Tj decreases, the voltage value of the voltage Vptat also decreases. In other words, a voltage change in the voltage Vbgr when the chip temperature Tj changes is smaller than that in the voltage Vptat.

The voltages Vbgr and Vptat output from the reference voltage generating circuit 20 are supplied to the V/F converting circuit 22 via the switch 21. Specifically, the voltage Vbgr is supplied to a terminal Pb of the switch 21, and the voltage Vptat is supplied to a terminal Pp of the switch 21. A common terminal C of the switch 21 is coupled to the input of the V/F converting circuit 22. The switch 21 is controlled by a switch control signal SW_C1 from the first counter circuit 23. That is, according to the voltage value of the switch control signal SW_C1, the terminal Pp or the terminal Pb is selectively coupled to the common terminal C. For example, when the switch control signal SW_C1 is at the high level, the terminal Pp is coupled to the common terminal C. When the switch control signal SW_C1 is at the low level, the terminal Pb is coupled to the common terminal C. Consequently, the first voltage Vptat and the second voltage Vbgr generated by the reference voltage generating circuit 20 are supplied to the V/F converting circuit 22 in a time division manner.

The V/F converting circuit 22 converts each of the first and second voltages Vptat and Vbgr supplied to a frequency and outputs the frequency. Specifically, the V/F converting circuit 22 generates and outputs a first signal having a frequency Fptat corresponding to the voltage value of the first voltage Vptat and a second signal having a frequency Fbgr corresponding to the voltage value of the second voltage Vbgr and outputs the signals. In this case, since the first voltage Vptat and the second voltage Vbgr are supplied in a time division manner to the V/F converting circuit 22, the V/F converting circuit 22 converts the first and second voltages Vptat and Vbgr to the first and second signals in a time division manner.

The first signal having the frequency Fptat and the second signal having the frequency Fbgr generated by the V/F converting circuit 22 are supplied to the first counter circuit 23. The first counter circuit 23 counts the first and second signals. That is, the first counter circuit 23 counts the voltage change in the first signal which changes according to the frequency Fptat and counts the voltage change in the second signal which changes according to the frequency Fbgr.

As will be described specifically later, the first counter circuit 23 generates a stop control signal STOP_a on the basis of the count value obtained by counting the first signal and outputs a piece of digital information corresponding to the first voltage Vptat as an AD conversion result 25 on the basis of a stop control signal STOP_b from the second counter circuit 24 and the count value of the second signal.

The second counter circuit 24 will be also specifically described later. A reference clock signal Fref (third signal) is supplied to the second counter circuit 24 and is counted. The second counter circuit 24 has a register (bits B3-0 to B3-$p$) storing a count value and generates the stop control signal STOP_b on the basis of the value stored in the register and the count value.

Configuration of Reference Voltage Generating Circuit 20

Figure 3:
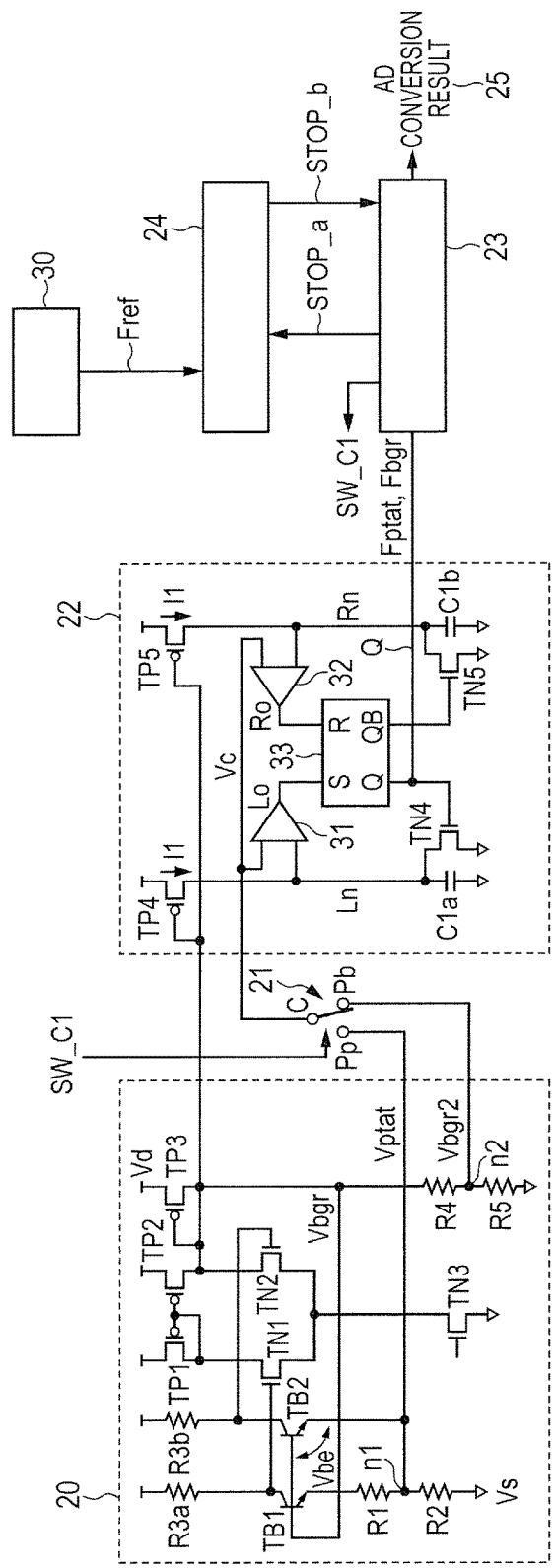
FIG. 3 is a circuit diagram illustrating the configuration of the temperature sensor according to the embodiment.

Next, the configuration of the above-described reference voltage generating circuit 20 will be described. FIG. 3 is a circuit diagram illustrating the configuration of the temperature sensor according to the embodiment. In the diagram, particularly, the configuration of the reference voltage generating circuit 20 and the V/F converting circuit 22 is specifically illustrated. Referring to FIG. 3, first, the reference voltage generating circuit 20 will be described.

The reference voltage generating circuit 20 has a circuit configuration known as a Brocaw Cell (Brokaw Bandgap reference). Specifically, the reference voltage generating circuit 20 has bipolar transistors (hereinbelow, called BP transistors) TB1 and TB2, resistive elements R1, R2, R3$a$, R3$b$, R4, and R5, N-channel-type field effect transistors (hereinbelow, called N-type MOSFETs) TN1 to TN3, and P-channel-type field effect transistors (hereinbelow, called P-type MOSFETs) TP1 to TP3.

In the reference voltage generating circuit 20, an amplification circuit is configured by the N-type MOSFETs TN1 to TN3, the P-type MOSFETs TP1 to TP3, and the resistive elements R4 and R5. That is, a differential transistor is configured by the N-type MOSFETs TN1 and TN2, and the P-type MOSFETs TP1 and TP2 configure a current mirror circuit and function as active loads of the differential transistor (TN1 and TN2). A predetermined voltage (not illustrated) is supplied to the gate of the N-type MOSFET TN3, and the N-type MOSFET TN3 functions as a constant current circuit supplying current to the differential transistor (TN1 and TN2).

An output from the drain of the differential transistor TN2 is supplied to the gate of the P-type MOSFET TP3, the source of the P-type MOSFET TP3 is coupled to a power supply voltage Vd, and the drain of the P-type MOSFET TP3 is coupled to a ground voltage Vs via a voltage dividing circuit. The voltage dividing circuit is configured by the resistive elements R4 and R5 coupled in series between the drain of the P-type MPSFET TP3 and the ground voltage Vs. An output of the amplification circuit is the drain of the P-type MOSFET TP3. The gate of the N-type MOSFET TN2 (differential transistor) corresponds to an inversion input terminal of the amplification circuit, and the gate of the N-type MOSFET TN1 (differential transistor) corresponds to a positive-phase input terminal of the amplification circuit.

The emitter size of the BP transistor TB1 is set to be larger than that of the BP transistor TB2, and the bases of the BP transistors TB1 and TB2 are commonly coupled, and are coupled to the drain of the P-type MOSFET TP3. The collector of the BP transistor TB1 and the collector of the BP transistor TB2 are coupled to the power supply voltage Vd via the resistive elements R3$a$ and R3$b$ having the same resistance value. The collectors of the BP transistors TB1 and TB2 are coupled to the positive-phase input terminal and the inversion input terminal of the amplification circuit. Consequently, the bases of the BP transistors TB1 and TB2 are biased by the amplification circuit so that currents having the same value flow in the BP transistors TB1 and TB2. The emitter of the BP transistor TB1 is coupled to the ground voltage Vs via the resistive elements R1 and R2 coupled in series, and the emitter of the BP transistor TB2 is coupled to a node n1 coupling the resistive elements R1 and R2.

By making currents of the same value flow in the BP transistors TB1 and TB2, the voltage between the base and the emitter (base-emitter voltage) of the BP transistor TB1 having a large emitter size becomes smaller than a base-emitter voltage Vbe of the BP transistor TB2 having a small emitter size. The difference voltage between the base-emitter voltage of the BP transistor TB1 and the base-emitter voltage of the BP transistor TB2 has positive temperature dependence. On the other hand, each of the base-emitter voltages has negative temperature dependence. By adding the voltage having positive temperature dependence and the voltage having negative temperature dependence, a voltage having small temperature dependence is obtained from the output of the amplification circuit. Since the Brocaw Cell reference voltage circuit is known, further description will not be given.

The output of the amplification circuit is the drain of the P-type MOSFET TP3. In the embodiment, the voltage in the drain of the P-type MOSFET TP3 is the second voltage Vbgr. On the other hand, the voltage in the node n1 coupling the resistors R1 and R2 is used as the first voltage Vptat.

Since the voltage divided by the resistive elements R1 and R2 is used as the first voltage Vptat, to match the values of the voltages, a voltage Vbgr2 obtained by dividing the second voltage Vbgr by the resistive elements R4 and R5 is used as a voltage supplied to the V/F converting circuit 22. The voltage Vbgr2 is output from the coupling node n2 coupling the resistive elements R4 and R5. In the embodiment, the voltage Vbgr2 will be also described as the second voltage.

The first voltage Vptat and the second voltages Vbgr and Vbgr2 generated by the reference voltage generating circuit 20 are expressed by the following equations. The first voltage Vptat is expressed by equation (1) and the second voltages Vbgr and Vbgr2 are expressed by equations (2) and (3), respectively.

$$Vptat = \frac{2kT}{q}\frac{R2}{R1}\ln \alpha \qquad \text{Equation (1)}$$

$$Vbgr = Vbe + \frac{2kT}{q}\frac{R2}{R1}\ln \alpha \qquad \text{Equation (2)}$$

$$Vbgr2 = \frac{R5}{R4+R5}Vbgr \qquad \text{Equation (3)}$$

In the equations, Vbe denotes the base-emitter voltage of the BT transistor, k denotes Boltzmann constant, T denotes absolute temperature, q denotes charge, and α indicates the emitter size ratio (the emitter size of TB1/emitter size of TB2) of the BT transistors TB1 and TB2. R1, R2, R4, and R5 indicate resistance values of the resistive elements R1, R2, R4, and R5.

Figure 7A:
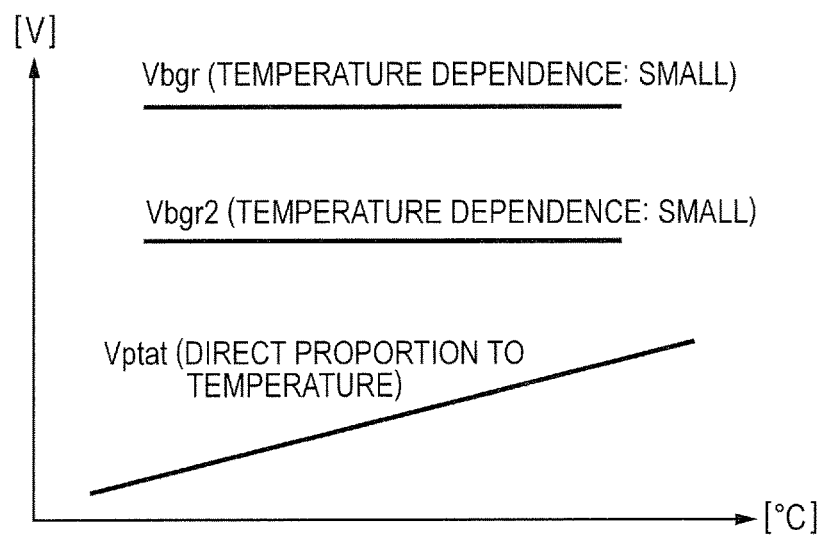
FIGS. 7A and 7B are characteristic diagrams illustrating temperature dependences of first and second voltages.

FIG. 7A is a characteristic diagram illustrating temperature dependences of the first voltage Vptat and the second voltages Vbar and Vbar2 generated by the reference voltage generating circuit 20. In the diagram, the horizontal axis indicates temperature, and the vertical axis indicates voltage. As illustrated in FIG. 7A, the first voltage Vptat is in direct proportion to increase of the temperature and its voltage value also increases. On the other hand, the voltage value of each of the second voltages Vbgr and Vbgr2 hardly changes and is almost constant when the temperature rises. Since the voltage Vbgr2 is divided, its voltage value is lower than that of the voltage Vbgr.

As described above, the reference voltage generating circuit 20 can generate the first voltage Vptat whose voltage value is in direct proportion to the temperature and the second voltages Vbgr and Vbgr2 each having a voltage value which is almost constant regardless of the temperature.

Configuration of V/F Converting Circuit 22

Next, referring to FIG. 3, the V/F converting circuit 22 will be described. The first voltage Vptat and the second voltage Vbgr2 generated by the reference voltage generating circuit 20 are supplied in a time division manner to the V/F converting circuit 22 via the switch 21. The V/F converting circuit 22 in the embodiment is configured by a so-called relaxation-type oscillation circuit.

The V/F converting circuit 22 has comparison circuits 31 and 32, a flip flop circuit 33, N-type MOSFETs TN4 and TN5, P-type MOSFETs TP4 and TP5, and capacitive elements C1a and C1b. The flip flop circuit 33 is a so-called RS-type flip flop circuit and has a set terminal S, a reset terminal R, an output terminal Q, and an inversion output terminal QB. In the embodiment, by supplying a high-level signal to the set terminal S, the output terminal Q outputs a high-level signal, and the inversion output terminal QB outputs a low-level signal. This output state is maintained until a high-level signal is supplied to the reset terminal R. By supplying a high-level signal to the reset terminal R, the output terminal Q outputs a low-level signal, and the inversion output terminal QB outputs a high-level signal. This output state is also maintained until a high-level signal is supplied to the set terminal S.

The gates of the P-type MOSFETs TP4 and TP5 are coupled to the gate of the above-described P-type MOSFET TP3, and the power supply voltage Vd is supplied to the sources of the P-type MOSFETs TP4 and TP5. The drain of the P-type MOSFET TP4 is coupled to the drain of the N-type MOSFET TN4 and one of terminals of the capacitive element C1a via a signal line Ln. The source of the N-type MOSFET TN4 and the other terminal of the capacitive element C1a are coupled to the ground voltage Vs. The gate of the N-type MOSFET TN4 is coupled to the output terminal Q of the flip flop circuit 33.

The drain of the P-type MOSFET TP5 is coupled to the drain of the N-type MOSFET TN5 and one of terminals of the capacitive element C1b via a signal line Rn. The source of the N-type MOSFET TN5 and the other terminal of the capacitive element C1b are coupled to the ground voltage Vs. The gate of the N-type MOSFET TN5 is coupled to the inversion output terminal QB of the flip flop circuit 33. The capacitive elements C1a and C1b have the same capacitance value.

To one of input terminals of each of the comparison circuits 31 and 32, the first voltage Vptat or the second voltage Vbgr2 is supplied via the switch 21. The first voltage Vptat and the second voltage Vbgr2 will be collectively referred to as a voltage Vc. The other input terminal of the comparison circuit 31 is coupled to the signal line Ln, and the output of the comparison circuit 31 is coupled to the set terminal S of the flip flop circuit 33. The other input terminal of the comparison circuit 32 is coupled to the signal line Rn, and the output of the comparison circuit 32 is coupled to the reset terminal R of the flip flop circuit 33.

When the voltage at the other input terminal of the comparison circuit 31, that is, the voltage in the signal line Ln exceeds the voltage value of the voltage Vc supplied to the one input terminal, the comparison circuit 31 outputs a high-level signal. On the other hand, when the voltage at the other input terminal of the comparison circuit 31, that is, the voltage in the signal line Ln becomes lower than the voltage value of the voltage Vc supplied to the one input terminal, the comparison circuit 31 outputs a low-level signal. Similarly, when the voltage in the signal line Rn exceeds the voltage value of the voltage Vc, the comparison circuit 32 outputs a high-level signal. When the voltage in the signal line Rn becomes lower than the voltage value of the voltage Vc, the comparison circuit 32 outputs a low-level signal.

Since the P-type MOSFETs TP4 and TP5 are commonly coupled to the gate of the P-type MOSFET TP3, the P-type MOSFETs TP4 and TP5 supply a current I1 proportional to current flowing in the P-type MOSFET TP3 to the signal lines Ln and Rn. An output of the V/F converting circuit 22 is output from the output terminal Q of the flip flop circuit 33.

Figure 5:
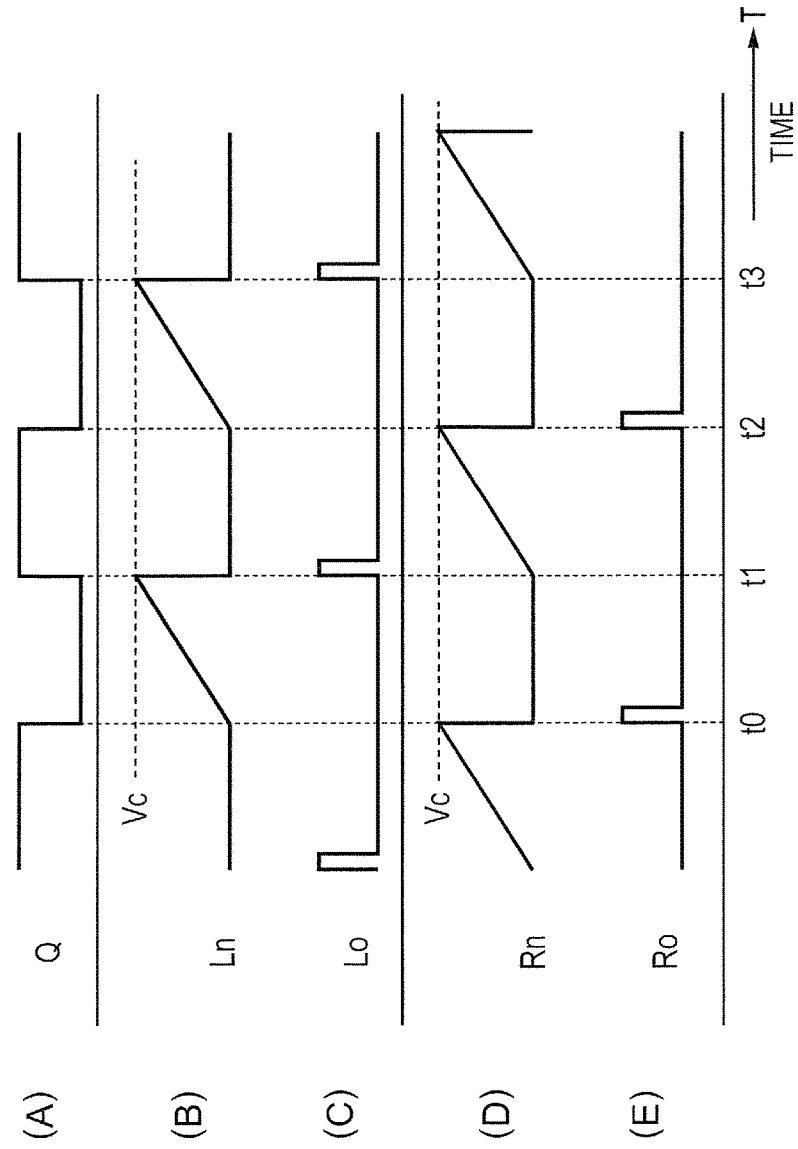
FIG. 5 is a waveform chart of waveforms (A) to (E) illustrating operations of a V/F converting circuit.

FIG. 5 is a waveform chart of waveforms (A) to (E) illustrating operations of the V/F converting circuit 22 depicted in FIG. 3. Referring now to the waveform chart, the operation of the V/F converting circuit 22 will be described. In FIG. 5, the horizontal axis indicates time, and the vertical axis indicates voltage. (A) in FIG. 5 indicates a voltage change in the output terminal of the flip flop circuit 33. Since the output terminal Q of the output of the V/F converting circuit 22, it can be regarded that (A) in FIG. 5 indicates the output of the V/F converting circuit 22. (B) and (D) in FIG. 5 illustrate voltage changes in the signal lines Ln and Rn, respectively. (C) and (E) in FIG. 5 illustrate voltage changes in the outputs of the comparison circuits 31 and 32, respectively.

Description will be given on assumption that the output terminal Q of the flip flop circuit 33 is at the high level at and before time t0. Since the voltage of the output terminal Q of the flip flop circuit 33 is at the high level, the N-type MOSFET TN4 enters the on state. Consequently, at or before time t0, the signal line Ln is at the low level as illustrated in (B) in FIG. 5. On the other hand, since the inversion output terminal QB of the flip flop circuit 33 outputs an inverted voltage to the output terminal Q, at or before time t0, the inversion output terminal QB outputs a low-level signal. Consequently, the N-type MOSFET TN5 enters the off state, the capacitive element C1b is charged by the current I1 flowing in the P-type MOSFET TP5, and the voltage of the signal line Rn gradually increases ((D) in FIG. 5).

When the voltage of the signal line Rn rises and reaches or exceeds the voltage Vc at time t0, an output Ro of the comparison circuit 32 changes to the high level as illustrated in (E) in FIG. 5. When the output Ro of the comparison circuit 32 becomes the high level, a high-level signal is supplied to the reset terminal R of the flip flop circuit 33. Therefore, the flip flop circuit 33 makes the inversion output terminal QB high level and makes the output terminal Q low level. When the inversion output terminal QB becomes the high level, the N-type MOSFET TN5 enters the on state, and the charges accumulated in the capacitive element C1b are discharged. Accordingly, the voltage of the signal line Rn changes to the low level ((D) in FIG. 5). When the voltage of the signal line Rn decreases, the output Ro of the comparison circuit 32 changes to the low level.

When the output terminal Q of the flip flop circuit 33 becomes the low level, the N-type MOSFET TN4 enters the off state. Accordingly, the capacitive element C1a is charged via the P-type MOSFET TP4, and the voltage of the signal line Ln gradually increases ((B) in FIG. 5). When the voltage of the signal line Ln reaches or exceeds the voltage Vc (time t1), an output Lo of the comparison circuit 31 becomes the high level ((C) in FIG. 5). When the output Lo changes to the high level, the output terminal Q of the flip flop circuit 33 changes to the high level, and the inversion output terminal QB changes to the low level.

The above operations are repeated. As described above, when the voltage value of the voltage Vc, that is, the first voltage Vptat or the second voltage Vbgr2 is high, it takes time until the voltage values of the signal lines Ln/Rn reach or exceed those voltage values. On the other hand, when the voltage value of the first voltage Vptat or the second voltage Vbgr2 is low, time until the voltage values of the signal lines Ln/Rn reach or exceed those voltage values become short. Consequently, according to the voltage value of the first voltage Vptat or the second voltage Vbgr2, time between the time t0 and the time t1 changes. As a result, a signal having the frequency Fptat or Fbgr corresponding to the voltage value of the first voltage Vptat or the second voltage Vbgr2 is output from the V/F converting circuit 22.

In the embodiment, by the single V/F converting circuit 22, the first voltage Vptat and the second voltage Vbgr2 are converted to the frequencies in a time division manner. Since the number of outputs of the V/F converting circuit 22 is one, the frequency of one signal shifts between the frequency Fptat corresponding to the voltage value of the first voltage Vptat and the frequency Fbgr corresponding to the voltage value of the second voltage Vbgr2. In the embodiment, usage of a signal having the frequency Fptat corresponding to the first voltage Vptat and usage of a signal having the frequency Fbgr corresponding to the second voltage Vbgr2 are different. Consequently, in the specification, the signal having the frequency Fptat corresponding to the first voltage Vptat will be called a first signal, and the signal having the frequency Fbgr corresponding to the second voltage Vbgr2 will be called a second signal.

In the embodiment, one V/F converting circuit is used in a time division manner. It is also possible to provide a plurality of V/F converting circuits and separately generate the first signal having the frequency Fptat corresponding to the first voltage Vptat and the second signal having the frequency Fbgr corresponding to the second voltage Vbgr2. By providing a plurality of V/F converting circuits as described above, although the number of V/F converting circuits increases, the switch 21 can be omitted.

The frequency Fptat corresponding to the first voltage Vptat, the frequency Fbgr corresponding to the second voltage Vbgr2, and the relation between the first voltage Vptat and the second voltage Vbgr2 are expressed by the following equations. Specifically, the current flowing in the P-type MOSFETs TP4 and TP5 is expressed by the equation (4), the relation between the frequency Fptat and the first voltage Vptat is expressed by the equation (5), and the relation between the frequency Fbgr and the second voltage Vbgr2 is expressed by the equation (6). C1 denotes the capacitance value of the capacitive elements C1a and C1b.

$$I1 = \frac{Vbgr}{R4 + R5} \quad \text{Equation (4)}$$

$$Fptat = \frac{I1}{2C1Vptat} \quad \text{Equation (5)}$$

$$Fbgr = \frac{I1}{2C1Vbgr2} \quad \text{Equation (6)}$$

Figure 7B:
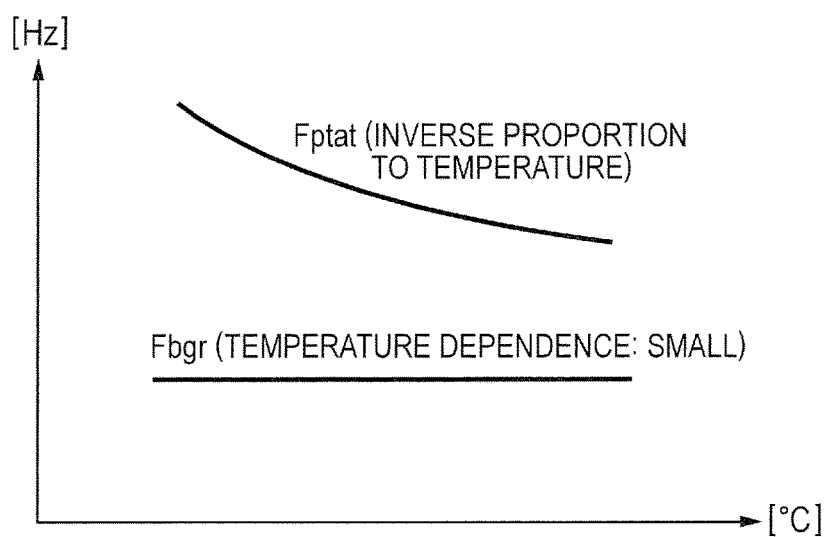

FIG. 7B is a characteristic diagram illustrating the relation between signals output from the V/F converting circuit 22 and temperature. In the diagram, the horizontal axis indicates temperature and the vertical axis indicates the frequencies of the signals. As illustrated in FIG. 5, when the voltage value of the voltage Vc (the first voltage Vptat or the second voltage Vbgr2) is high, the time between the time t0 and the time t1 becomes long. When the voltage value of the voltage Vc is low, the time between the time t0 and the time t1 becomes short. That is, when the voltage Vc is high, the frequency of the signal output from the F/V converting circuit 22 becomes low. When the voltage Vc is low, the frequency of the signal output from the F/V converting circuit 22 is high.

As described above, the voltage value of the first voltage Vptat changes in direct proportion to the temperature. Therefore, as illustrated in FIG. 7B, when the first voltage Vptat is converting to frequency, the frequency Fptat corresponding to the first voltage Vptat is in inverse proportion to the temperature. That is, when the temperature rises, as illustrated in FIG. 7B, the frequency Fptat becomes low. On the other hand, the voltage value of the second voltage Vbgr2 hardly changes with respect to the temperature. Consequently, as illustrated in FIG. 7B, the value of the frequency Fbgr corresponding to the second voltage Vbgr2 is almost constant regardless of changes of the temperature. In other words, the first signal corresponding to the first voltage Vptat has a frequency which is in inverse proportion to the temperature, and the second signal corresponding to the second voltage Vbgr2 is a signal having small temperature dependence.

The first and second counter circuits 23 and 24 will now be described. FIG. 3 illustrates the first counter circuit 23, the second counter circuit 24, and an oscillation circuit 30 generating the reference clock signal Fref. The first and second counter circuits 23 and 24 will be described later with reference to FIG. 4. The oscillation circuit 30 generates the reference clock signal Fref by using, for example, a PLL circuit. Obviously, the invention is not limited to a PLL circuit. The oscillation circuit 30 may be provided in the same semiconductor device 10 or on the outside of the semiconductor device 10.

Configuration of First Counter Circuit 23

Figure 4:
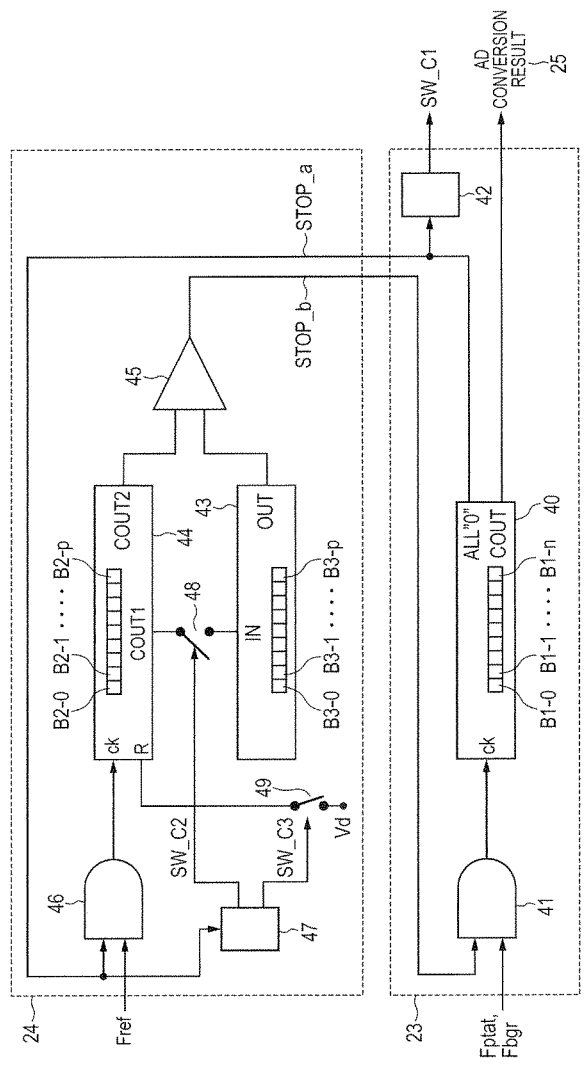
FIG. 4 is a block diagram illustrating the configuration of a first counter circuit and a second counter circuit according to the embodiment.

FIG. 4 is a block diagram illustrating the configuration of the first counter circuit 23 and the second counter circuit 24 provided for the semiconductor device 10 according to the embodiment. First, the first counter circuit 23 will be described.

The first counter circuit 23 has a counter 40 (first counter), a 2-input AND circuit 41, and a control circuit 42. The counter 40 has a plurality of bits. Each time the voltage of a signal supplied to a clock terminal ck changes, for example, from the low level to the high level, the logic value stored in a bit is changed. In FIG. 4, a plurality of bits provided for the counter 40 are schematically illustrated as B1-0 to B1-$n$. The bit B1-0 indicates the least significant bit, and B1-$n$ indicates the most significant bit. The counter 40 counts a voltage change in the signal supplied to the clock terminal ck and changes the logic value stored in each of the bits B1-0 to B1-$n$ from "0" to "1". In the embodiment, in an initial state before the counting is performed, the logic value "0" is stored in each of the bits B1-0 to B1-$n$. According to the number of times of voltage changes in a signal supplied to the clock terminal ck, the logic values "0" stored in the bits B1-0 to B1-$n$ are gradually changed to the logic value "1". The values of the bits B1-0 to B1-$n$ are a count value of the counter 40 and output as a count value COUT.

The counting progresses and a count value in a state in which all of the logic values "0" stored in the bits B1-0 to B1-$n$ are changed to the logic values "1" becomes the largest countable count value. After that, when the voltage of the signal supplied to the clock terminal ck changes, the initial state is set again. That is, each of the bits B1-0 to B1-$n$ enters the initial state where the logic value "0" is stored. By counting voltage changes in signals in the clock terminal ck, the logic values of the bits B1-0 to B1-$n$ are changed to "1". After that, the same operation is repeated. The counter 40 has a terminal outputting an ALL "0" signal and, when the logic value of the counter becomes "0", outputs the ALL "0" signal of the low level. Consequently, when the counting by the counter 40 progresses and the count value reaches the largest countable value, the ALL "0" signal (low level) is generated.

To one of input terminals of the 2-input AND circuit 41, the stop control signal STOP_b from the second counter circuit 24 is supplied. To the other input terminal of the 2-input AND circuit 41, an output of the V/F converting circuit 22 described with reference to FIG. 3 is supplied. An output of the 2-input AND circuit 41 is coupled to the clock terminal ck of the counter 40. With the configuration, when the stop control signal STOP_b at the high level is output from the second counter circuit 24, the 2-input AND circuit 41 transmits a voltage change in a signal output from the V/F converting circuit 22 to the clock terminal ck of the counter 40. On the other hand, when the stop control signal STOP_b of the low level is output from the second counter circuit 24, the 2-input AND circuit 41 pins the voltage of the clock terminal ck of the counter 40 to the low level and stops counting by the counter 40.

The ALL "0" signal of the counter 40 is supplied as the stop control signal STOP_a to the second counter circuit 24 (FIG. 3) and the control circuit 42.

The control circuit 42 generates the switch control signal SW_C1 on the basis of the stop control signal STOP_a. In the embodiment, each time the stop control signal STOP_a changes to the low level, the control circuit 42 changes the voltage of the switch control signal SW_C1 from the high level to the low level (or from the low level to the high level). For example, when the ALL "0" signal changes to the low level in a state where the switch control signal SW_C1 of the low level is output, the control circuit 42 changes the, voltage of the switch control signal SW_C1 from the low level to the high level and maintains the high level until the ALL "0" signal changes again to the low level.

Configuration of Second Counter Circuit 24

The second counter circuit 24 has a register 43, a counter (second counter) 44, a comparison circuit 45, a 2-input AND circuit 46, a control circuit 47, and switches 48 and 49.

The counter 44 also has a plurality of bits like the counter 40. In FIG. 4, a plurality of bits of the counter 44 are schematically indicated as bits B2-0 to B2-$p$. In this case as well, the bit B2-0 indicates the least significant bit, and B2-$p$ indicates the most significant bit. The counter 44 has the clock terminal ck and counts a voltage change in the signal supplied to the clock terminal ck. That is, each time the voltage of the signal stored in the clock terminal ck changes from the low level to the high level, the logic value stored in each of the bits B2-0 to B2-$p$ is sequentially changed from "0" to "1". A piece of digital information expressed by the bits B2-0 to B2-$p$ becomes a count value obtained by counting a signal supplied to the clock terminal ck by the counter 44. The count value is output as count values COUT1 and COUT2 from the counter 44. The counter 44 has the reset terminal R. By supplying predetermined voltage (for example, power supply voltage Vd) to the reset terminal R, the counter 44 is reset. That is, each of the bits B2-0 to B2-$p$ is set to a predetermined value, for example, the logic value "0" (initial state).

The count value COUT1 output from the counter 44 is supplied to an input terminal IN of the register 43 via the switch 48. In the embodiment, the register 43 has bits of the same number as that of the counter 44. In the diagram, the bits of the register 43 are schematically expressed as bits B3-0 to B3-$p$. In this case as well, the bit B3-0 indicates the least significant bit, and B3-$p$ indicates the most significant bit. The bits B2-0 to B2-$p$ in the count value COUT1 supplied to the input terminal IN are supplied to the corresponding bits B3-0 to B3-$p$ in the register 43 and held. The register 43 outputs a piece of digital information (count value COUT1) held as an output OUT.

The comparison circuit 45 compares the count value COUT2 output from the counter 44 with the output OUT of the register 43. In the embodiment, when the count value COUT2 and the output of the register 43 match, the comparison circuit 45 outputs a low-level signal. When they don't match, the comparison circuit 45 outputs a high-level signal. An output of the comparison circuit 45 is set as the stop control signal STOP_b output from the second counter circuit 24.

The stop control signal STOP_a output from the first counter circuit 23 is supplied to one of input terminals of the 2-input AND circuit 46. To the other input terminal of the 2-input AND circuit 46, the reference clock signal Fref output from the oscillation circuit 30 (FIG. 3) is supplied. An output of the 2-input AND circuit 46 is supplied to the clock terminal ck of the counter 44.

The stop control signal STOP_a is further supplied to the control circuit 47. On the basis of the stop control signal STOP_a, the control circuit 47 generates switch control signals SW_C2 and SW_C3 which turn on/off the switches 48 and 49. The switch 49 is coupled between the reset terminal R of the counter 44 and the power supply voltage Vd.

When the stop control signal STOP_a is at the high level, the control circuit 47 sets each of the switch control signals SW_C2 and SW_C3 to the low level. By the operation, both of the switches 48 and 49 enter the off state. On the other hand, when the stop control signal STOP_a changes from the high level to the low level, the control circuit 47 changes the switch control signal SW_C2 from the low level to the high level and, after predetermined time, changes the signal again from the high level to the low level. After changing the switch control signal SW_C2 from the high level to the low level, the control circuit 47 changes the switch control signal SW_C3 from the low level to the high level and, after predetermined time, changes the signal again from the high level to the low level. When the stop control signal STOP_a changes to the low level by the above operation, by the high level of the switch control signal SW_C2, the switch 48 enters the on state, and the count value COUT1 of the counter 44 is supplied to the input terminal IN of the register 43 via the switch 48. After supply of the count value COUT1 to the register 43, the switch 48 is set to the off state by the low-level switch control signal SW_C2. After that, the switch 49 is set to the on state by the high-level switch control signal SW_C3, the power supply voltage Vd is supplied via the switch 49 to the reset terminal R of the counter 44, and the counter 44 is set to the initial state.

In the embodiment, the number of bits (B2-0 to B2-$p$) of the counter 44 is set to be larger than the number of bits (B1-0 o B1-$n$) of the counter 40. In other words, the largest countable count value of the counter 44 is set to be larger than the largest countable count value of the counter 40. Since the counter 44 is used to measure time, by setting the bit number to be larger than that of the counter 40 as described above, the measurement time can be set more finely. Obviously, the number of bits of the counter 44 and that of the counter 40 may be set to the same. In other words, the largest countable count values of the counters 40 and 44 may be the same.

The number of bits (B2-0 to B2-*p*) of the counter 44 and the number of bits (B3-0 to B3-*p*) of the register 43 are set to be the same. Although not limited, the frequency of the reference clock signal Fref is, for example, 40 MHz to 100 MHz.

Operation of First Counter Circuit 23 and Second Counter Circuit 24

Before explaining the general operation of the temperature sensor 14, the operation of the first and second counters 23 and 24 will be described.

It is assumed that the stop control signal STOP_b is at the high level, and the counter 40 is in the initial state (all of the bits B1-0 to B1-*n* have the logic value "0"). Since all of the bits B1-0 to B1-*n* of the counter 40 have the logic value "0", the stop control signal STOP_a is at the low level and, by the low-level stop control signal STOP_a, the control circuit 42 in the first counter circuit 23 changes the switch control signal SW_C1 to the high level.

Since the switch control signal SW_C1 is at the high level, the common terminal C of the switch 21 (FIG. 3) is coupled to the terminal Pp. Since the high-level stop control signal STOP_b is supplied to one of the input terminals of the 2-input AND circuit 41 in the first counter circuit 23, the 2-input AND circuit 41 transmits the signal supplied to the other input terminal to the clock terminal ck of the counter 40. In this case, the first voltage Vptat is supplied from the reference voltage generating circuit 20 to the V/F converting circuit 22 via the switch 21, so that the signal supplied to the clock terminal ck of the counter 40 becomes a signal (first signal) having the frequency Fptat corresponding to the first voltage Vptat.

The counter 40 counts a voltage change in the signal (first signal) supplied to the clock terminal ck. By the counting, the count value (the values of the bits B1-0 to B1-*n*) changes. When the counter 40 starts the counting, the ALL "0" signal changes from the low level to the high level. That is, the stop control signal STOP_a changes from the low level to the high level.

When the stop control signal STOP_a becomes the high level, the 2-input AND circuit 46 in the second counter circuit 24 transmits the reference clock signal Fref to the clock terminal ck of the counter 44. Since the stop control signal STOP_a is at the high level, the control circuit 47 sets the switches 48 and 49 to the off state. Consequently, the counter 44 counts a voltage change in the reference clock signal Fref which is supplied to the clock terminal ck. At this time, the register 43 holds a value in a preceding state. Consequently, the count value COUT2 (B2-0 to B2-*p*) of the counter 44 and the output OUT from the register 43 do not match. Therefore, the comparison circuit 45 continuously outputs the high-level stop control signal STOP_b.

When the counting by the counter 40 in the first counter circuit 23 progresses, the count value COUT becomes the largest countable value (each of B1-0 to B1-*n* has the logic value "1"). Next, when the voltage of the signal (first signal) supplied to the clock terminal ck changes, the counter 40 changes the ALL "0" signal from the high level to the low level. That is, the stop control signal STOP_a changes to the low level. By the change to the low level, the 2-input AND circuit 46 in the second counter circuit 24 stops transmitting the reference clock signal Fref to the clock terminal ck of the counter 44. On the other hand, the control circuit 47 sets the switch 48 to the on state. Accordingly, the count value COUT1 (B2-0 to B2-*p*) of the counter 44 is supplied to the input terminal IN of the register 43 via the switch 48. The register 43 stores the supplied count value COUT1 (B2-0 to B2-*p*) as a piece of digital information (B3-0 to B3-*p*) and outputs it as the output OUT.

The count value COUT1 (B2-0 to B2-*p*) supplied to the register 43 refers to time required for the counter 40 to count the first signal (signal having the frequency Fptat corresponding to the first voltage Vptat) from the initial state (all of B1-0 to B1-*n* have the logic value "0") to the largest countable value (all of B1-0 to B1-*n* have the logic value "1") and corresponds to a count value of counting the reference clock signal Fref by the counter 44. That is, a piece of information corresponding to time required that the number of times of voltage changes of the first signal reaches the largest countable count value from the initial state of the counter 40 is stored in the register 43. In other words, the second counter circuit 24 can be regarded as a time measuring circuit.

When the stop control signal STOP_a changes to the low level, the control circuit 42 in the first counter circuit 23 changes the switch control signal SW_C1 from the high level to the low level. By the operation, in the switch 21, the common terminal C is coupled to the terminal Pb.

The control circuit 47 sets the switch 48 to the off state and, after that, sets the switch 49 to the on state. By the operation, the counter 44 enters the initial state (B2-0 to B2-*p* have the logic value "0"). Since the count value COUT2 and the output OUT of the register 43 do not match, the comparison circuit 45 continuously outputs a high-level signal. That is, the stop control signal STOP_b is in the high-level state.

Consequently, to the clock terminal ck of the counter 40 in the first counter circuit 23, the signal (second signal) having the frequency Fbgr corresponding to the second voltage Vbgr2 is transmitted via the 2-input AND circuit 41. According to a voltage change in the transmitted second signal, the count value (B1-0 to B1-*n*) of the counter 40 changes. When the counter 40 starts counting, the ALL "0" signal of the counter 40 changes from the low level to the high level. That is, the stop control signal STOP_a becomes the high level again. As a result, the 2-input AND circuit 46 in the second counter circuit 24 transmits the reference clock signal Fref to the clock terminal ck of the counter 44.

When the reference clock signal Fref is supplied, the counter 44 counts a voltage change in the reference clock signal Fref. By the counting, the count value of the counter 44 changes from the initial state (all of B2-0 to B2-*p* have the logic value "0") toward the largest count value (all of B2-0 to B2-*p* have the logic value "1") which can be counted by the counter 44. When the count value COUNT2 of the counter 44 and the digital value (B3-0 to B3-*p*) stored in the register 43 match in a process that the count value of the counter 44 changes, an output signal of the comparison circuit 45, that is, the stop control signal STOP_b changes from the high level to the low level.

When the stop control signal STOP_b changes to the low level, the 2-input AND circuit 41 in the first counter 23 stops transmission of the second signal (signal having the frequency Fbgr corresponding to the second voltage Vbgr2) to the clock terminal ck of the counter 40. That is, the counting of the counter 40 is stopped. The count value (B1-0 to B1-*n*)

of the counter 40 at the time of the stop is the AD conversion result 25 expressing the voltage value of the first voltage Vptat as a piece of digital information.

For example, by setting the counters 40 and 44 to the initial state by resetting or the like, the state described first is obtained. By repeating the above-described operations, the piece of digital information corresponding to the first voltage Vptat can be obtained as the count value (B1-0 to B1-$n$) of the counter 40.

Figure 10:
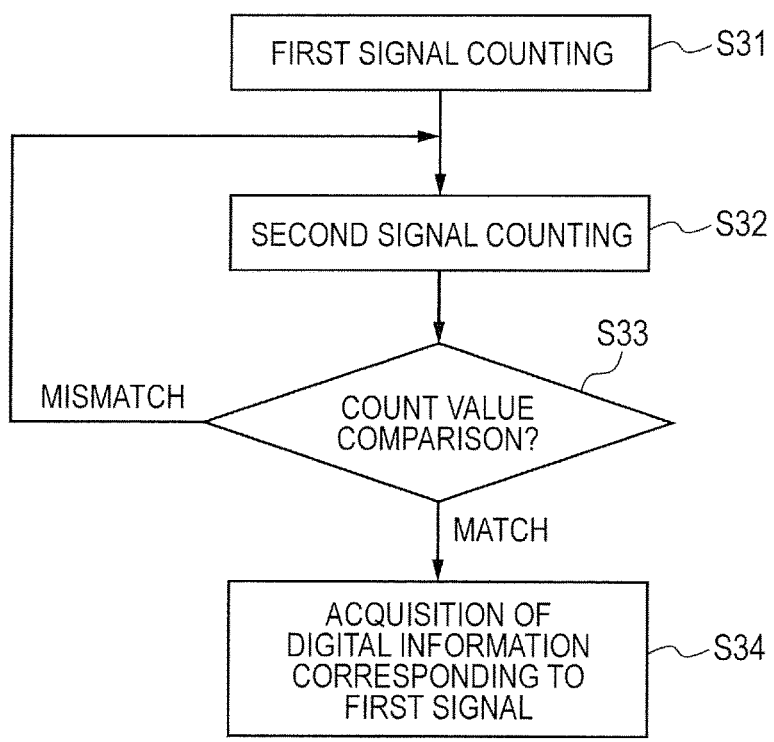
FIG. 10 is a flowchart illustrating operations related to the embodiment.

The counting operation of the first and second counter circuits 23 and 24 corresponds to step S3 in FIG. 9. FIG. 10 is a flowchart more specifically illustrating a part of the operations performed in step S3 in FIG. 9. The relation between the steps illustrated in FIG. 10 and the counting operation of the first and second counter circuits 23 and 24.

Step S31 in FIG. 10 is a step of counting a first signal. In the step S31, the counter 40 counts the first signal until the signal reaches the largest countable count value from the initial state and stores time required for the first signal to reach the largest count value as a count value of the counter 44 into the register 43. Next, in step S32, the second signal is counted by the counter 40. In step S33, the count value of the counter 44 and the count value stored in the register 43 are compared. When the values do not match as a result of the comparison, the program returns to step S32 and the counting of the second signal is continued. The steps S32 and 33 are repeated until a match is detected in the step S33. When a match of the comparison is detected in step S33, the count value of the counter 40 at that time is obtained as a piece of digital information corresponding to the first signal (step S34).

Operation of Temperature Sensor

Next, the operation of the temperature sensor 14 according to the embodiment will be described by using mainly FIGS. 3 and 4.

The counters 40 and 44 are, for example, reset to be set in the initial state. The reference voltage generating circuit 20 generates the first voltage Vptat which changes in direct proportion to the temperature Tj of the semiconductor chip and the second voltages Vbgr and Vbgr2 which hardly depend on the temperature Tj. Since the counter 40 is set to the initial state, the switch control signal SW_C1 becomes the high level. Accordingly, the common terminal C of the switch 21 is coupled to the terminal Pp, and the first voltage Vptat as one of the voltages generated by the reference voltage generating circuit 20 is supplied to the V/F converting circuit 22.

The V/F converting circuit 22 converts the supplied first voltage Vptat to a signal (first signal) having the frequency Fptat corresponding to the voltage value of the first voltage Vptat. That is, the V/F converting circuit 22 generates a signal (first signal) having a frequency which is in inverse proportion to a change in the voltage value of the first voltage Vptat.

The generated first signal is supplied to the first counter circuit 23. The first and second counter circuits 23 and 24 start operations substantially at the same time. As described in "Operation of First Counter Circuit 23 and Second Counter Circuit 24", the signal having the frequency Fptat corresponding to the first voltage is counted by the counter 40 in the first counter circuit 23, and the reference clock signal Fref is counted by the counter 44 in the second counter circuit 24.

The counter 40 in the first counter circuit 23 counts a voltage change in the first signal from the initial state (zero) of the counter 40 to the largest countable count value (full scale). When the count value of the counter 40 reaches the largest countable count value (full scale), the stop control signal STOP_a (low level) is supplied from the first counter circuit 23 to the second counter circuit 24.

In the second counter circuit 24, when the stop control signal STOP_a (low level) is received, the counter 44 in the second counter circuit 24 stops counting, and the count value of the counter 44 is stored in the register 43 in the second counter circuit 24. When the count value is stored into the register 43, the counter 44 is reset and enters the initial state.

In response to the stop control signal STOP_a (low level), the common terminal C of the switch 21 is coupled to the terminal Pb. The second voltage Vbgr2 which hardly depends on the temperature Tj of the semiconductor chip as one of the voltages generated in the reference voltage generating circuit 20 is supplied from the reference voltage generating circuit 20 to the V/F converting circuit 22 via the switch 21. Accordingly, the V/F converting circuit 22 generates the signal (second signal) having the frequency Fbgr which hardly depends on the temperature Tj and supplies it to the first counter circuit 23.

The first and second counter circuits 23 and 24 start operations substantially at the same time. As described in "Operation of First Counter Circuit 23 and Second Counter Circuit 24", in this case, the counter 40 in the first counter circuit 23 counts the signal (second signal) having the frequency Fbgr corresponding to the second voltage Vbgr2, and the counter 44 in the second counter circuit 24 counts the reference clock signal Fref. When the count value stored in the register 43 in the second counter circuit 24 and the count value of the counter 44 match, the second counter circuit 24 generates the stop control signal STOP_b (low level).

The stop control signal STOP_b (low level) is supplied to the first counter circuit 23, and the counting by the counter 40 in the first counter circuit 23 is stopped. That is, the counter 40 counts the second signal having the frequency Fbgr which hardly depends on the temperature Tj only by the same time as the time required to count the signal (first signal) having the frequency Fptat corresponding to the first voltage Vptat from the initial state (zero) of the counter 40 to the largest countable count value (full scale). Accordingly, a piece of digital information corresponding to the first voltage Vptat depending on the temperature Tj is obtained from the counter 40.

FIGS. 6A and 6B are explanatory diagrams illustrating operations of the counters 40 and 44 depicted in FIG. 4. In the diagrams, the horizontal axis denotes time, and the vertical axes indicate the count values (Nbit CNT and Mbit CNT). FIG. 6A denotes changes in the count value of the counter 40, and FIG. 6B denotes changes in the count value of the counter 44.

The full scale Nfull indicated by the vertical axis of FIG. 6A indicates the largest count value which can be counted by the counter 40. 0 (zero) in the vertical axis of the diagram indicates the initial state of the counter 40. In comparison to FIG. 4, the state where all of the bits B1-0 to B1-$n$ have the logic value "0" corresponds to 0 (zero), and the state where all of the bits B1-0 to B1-$n$ have the logic value "1" corresponds to the full scale Nfull.

When the common terminal C and the terminal Pp of the switch 21 (FIG. 3) are coupled (in FIGS. 6A and 6B, described as switch 21:C-Pp), the counter 40 counts a voltage change in the signal (first signal) having the frequency Fptat corresponding to the voltage value of the first voltage Vptat. Accordingly, the count value of the counter gradually increases from the initial state (zero) and reaches the full scale Nfull. By the reach, the stop control signal STOP_a (low level) is generated.

When the counter 40 is counting the voltage change in the first signal, the counter 44 counts the voltage change in the reference clock signal Fref. Consequently, the count value of the counter 44 gradually increases with lapse of time. When the stop control signal STOP_a is generated at time t11, the count value of the counter 44 at that time is stored in the register 43. In FIG. 6B, the count value stored in the register 43 is indicated as the register value. The register value stored in the register 43 corresponds to time TT1 since the counter 40 counts the voltage change in the first signal until the value reaches the full scale Nfull from zero.

When the stop control signal STOP_a is generated, the common terminal C of the switch 21 is coupled to the terminal Pb (in FIGS. 6A and 6B, described as switch 21:C-Pb). In this case, the counter 40 counts the voltage changes in the second signal having the frequency Fbgr corresponding to the second voltage Vbgr2. Also in this case, the counter 44 counts the voltage changes in the reference clock signal Fref. When the count value of the counter 44 and the count value of the register 43 match, the stop control signal STOP_b (low level) is generated from the second counter circuit 24. By the generation of the stop control signal STOP_b, the counting of the counter 40 is stopped.

The voltage changes in the first signal are counted and the value (count value) corresponding to the time TT1 required until the value reaches the full scale Nfull from zero is stored in the register 43, so that voltage changes in the second signal corresponding to the second voltage which hardly depends on the temperature Tj are counted only for the same time. Consequently, a piece of digital information corresponding to the first voltage Vptat expressed by all of the bits B1-0 to B1-$n$ of the counter 40 can be obtained. In FIG. 6A, Nx indicates the count value of the counter 40 when the stop control signal STOP_b is generated.

In FIGS. 6A and 6B, during the period from time 0 to time t11 ($0 \leq T \leq t11$), the count value N of the counter 40 is expressed by Equation (7) and the time t11 when the count value of the counter 40 becomes the full scale is expressed by Equation (8). In FIGS. 6A and 6B, during the period from time t11 to time 2t11 ($t11 \leq T \leq 2t11$), the count value N of the counter 40 is expressed by Equation (9), and the count value Nx of the counter 40 at the time 2t11 is expressed by Equation (10). The relation between the count value Nx and the full-scale count value Nfull is expressed by Equation (11).

$$N = Fptat \times T = I1/(C1 \times Vptat) \times T \quad \text{Equation (7)}$$

$$Nfull = I1/(C1 \times Vptat) \times t11, t11 = (C1 \times Vptat)/I1 \times Nfull \quad \text{Equation (8)}$$

$$N = Fbgr \times (T-t11) = (C1 \times Vbgr2)/I1 \times (T-t11) \quad \text{Equation (9)}$$

$$Nx = Fbgr \times (2t11-t11) = I1/(C1 \times Vbgr2) \times (C1 \times Vptat)/I1 \times Nfull = Vptat/Vbgr2 \times Nfull \quad \text{Equation (10)}$$

$$Nx/Nfull = Vptat/Vbgr2 \quad \text{Equation (11)}$$

In the embodiment, the first voltage Vptat depending on the temperature Tj and the second voltage Vbgr2 which hardly depends on the temperature Tj are converted to the signal (first signal) having the frequency Fptat corresponding to the first voltage Vptat and the signal (second signal) having the frequency Fbgr corresponding to the second voltage Vbgr2 in a time division manner by the single V/F converting circuit 22. It can suppress increase in the occupation area. Since the conversion is performed in a time division manner, it is easy to obtain a count value related to the first signal first and count the second signal for only the same time by using the obtained count value.

In the case of converting the first and second voltages Vptat and Vbgr2 to frequencies by different V/F converting circuits, an error which occurs in each of the conversions varies among the V/F converting circuits used, and it cannot be guaranteed that the values of the errors become the same. On the other hand, in the embodiment, since the first and second voltages Vptat and Vbgr2 are converted by the common V/F converting circuit 22, errors occurring at the time of converting the voltages to frequencies can be made the same. Since the errors occurring are the same, by obtaining the ratio of the count values (Nx, Nfull) as expressed by Equation (11), the error can be cancelled, and precision can be improved.

In the embodiment, the voltage change in the signal (first signal) of the frequency Fptat depending on the temperature Tj is counted to the largest count value (full-scale count value) which can be counted by the counter 40, and the time required for the counting is measured by the second counter circuit 24 (time measuring circuit). The voltage change in the signal (second signal) of the frequency Fbgr which hardly depends on the time Tj is counted only by the same time as the time obtained by the measurement. Consequently, as understood from Equation (11), a temperature step per count can be determined. That is, a temperature step expressed by the least significant bit can be determined, so that resolution can be determined. Desired resolution can be obtained by, for example, changing the largest count value which can be counted by the counter 40, and arbitrary resolution can be easily obtained.

In the embodiment, the first signal having the frequency Fptat depending on the temperature Tj is counted by the counter 40 to the largest count value ($2^n-1$) which can be counted by the counter 40. Consequently, the AD conversion result 25 using the largest count value ($2^n-1$) as the full scale is always obtained. Therefore, the precision can be improved. The full-scale temperature can be determined from the relation between the first voltage Vptat and the second voltage Vbgr2. By the constant of the circuit determining the first and second voltages Vptat and Vbgr2, the full-scale temperature can be set to a predetermined value. In this case, by dividing the full-scale temperature by the largest count value (2n-1) which can be counted by the counter 40, the resolution can be determined to a predetermined value.

Further, for the first and second signals, the counter 40 is used as a common counter, and the counter measuring time is also commonly used as the counter 44. Consequently, increase in the occupation area can be suppressed. Moreover, the first and second signals are counted in a time division manner by using the counter 40 as the common counter. Therefore, even errors occur due to the counter at the time of counting the first and second signals, the errors can be made the same.

In the embodiment, the number of bits (B2-0 to B2-$p$) of the counter 44 measuring time is set to be larger than the number of bits (B1-0 to B1-$n$) of the counter 40 counting the first signal. Consequently, measurement time for one count of the counter 40 can be made finer, and the measurement time can be obtained with higher precision.

By adjusting the number of bits of the counter 44, as the reference clock signal Fref supplied to the counter 44, a clock signal having an arbitrary frequency can be used. In the embodiment, the reference clock signal Fref is generated by using the oscillation circuit 30. A clock signal already existing in the semiconductor device 10 may be used as the reference clock signal Fref.

As the AD converting circuit, a circuit of obtaining a piece of digital information corresponding to a first voltage by generating a reference voltage by a voltage dividing circuit and comparing the first voltage and the reference voltage is considered. In the case of such an AD converting circuit, when the number of bits of the piece of digital information is increased, the number of reference voltages increases, so that the occupation area of the AD converting circuit increases. In contract, since the piece of digital information corresponding to the first voltage is obtained by using the first counter circuit and the time measuring circuit, even when the number of bits of the piece of digital information is increased, increase in the occupation area can be suppressed.

Although the present invention achieved by the inventors herein has been concretely described above on the basis of the embodiment, obviously, the present invention is not limited to the foregoing embodiment and can be variously changed without departing from the gist.

For example, in the embodiment, the counters 40 and 44 have been described as so-called up-counters whose count values sequentially increase (up) for voltage changes of signals supplied to the clock terminal ck. Alternatively, the counter 40 and/or the counter 44 may be a so-called down counter. In the case of a down counter, the count value sequentially decreases (down) for voltage changes in signals supplied to the clock terminal ck. Consequently, in the case of using a down counter as the counter 40, in the initial state, each of the bits B1-0 to B1-$n$ of the counter 40 has the logic value "1", and each of the bits B1-0 to B1-$n$ of the largest countable count value has the logic value "0". In this case, it is sufficient to generate an ALL "1" signal from the counter 40 when the logic values of all of the bits become "1" and use the ALL "1" signal in place of the ALL "0" signal. Since the counter 40 may be configured by a down counter, the largest count value which can be counted by the counter 40 includes not only the case where all of the bits B1-0 to B1-$n$ of the counter 40 become the logic value "1" but also the case where all of them become the logic value "0".

The configuration of the first and second counter circuits 23 and 24 is not limited to the configuration illustrated in FIG. 4. For example, the comparison circuit 45 may operate when the counter 40 counts the second signal. For example, the operation of the comparison circuit 45 may be controlled by the switch control signal SW_C1. That is, when the switch control signal SW_C1 is at the low level, the comparison circuit 45 performs comparing operation.

Figure 8:
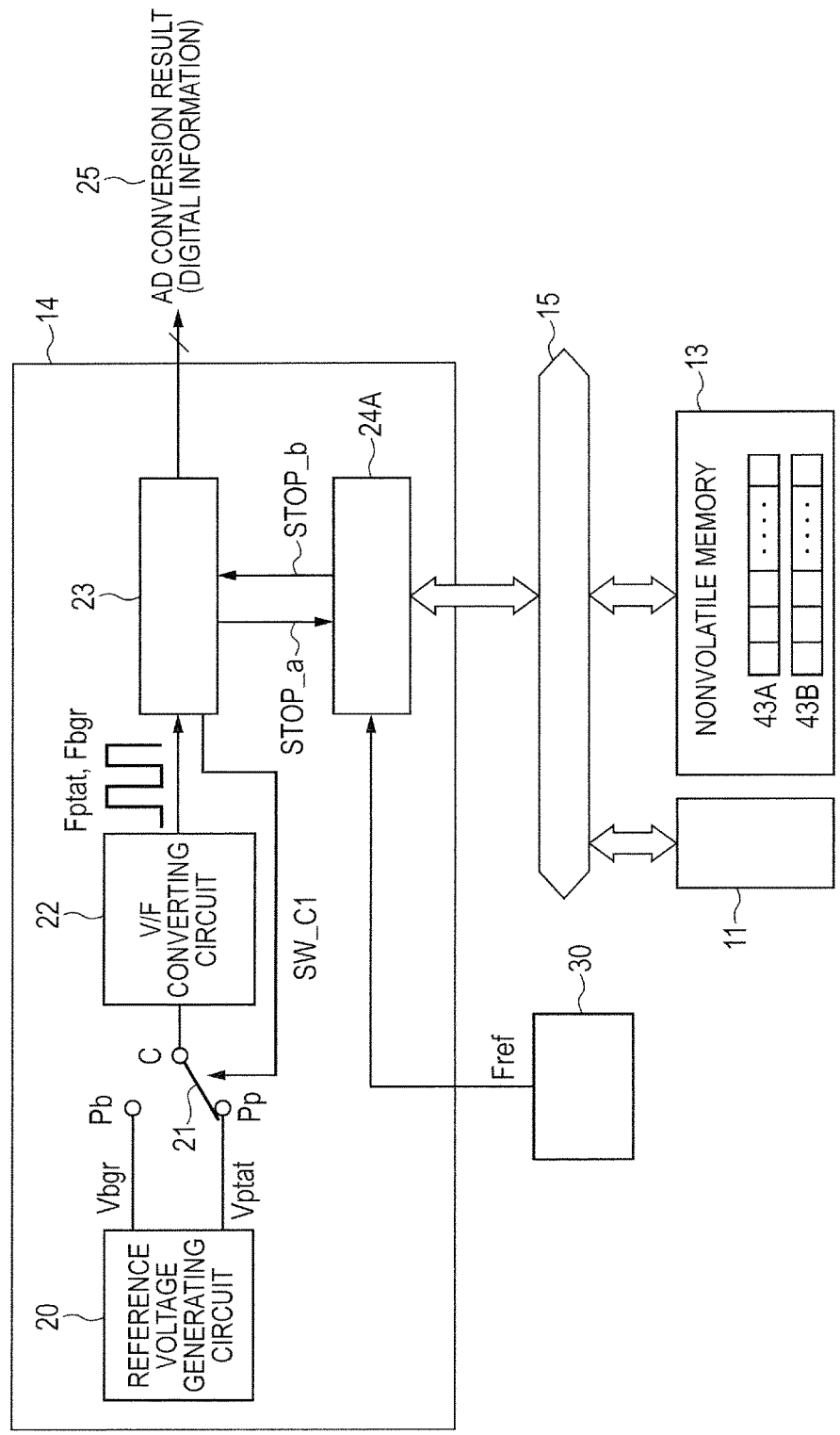
FIG. 8 is a block diagram illustrating the configuration of a semiconductor device according to a modification.

In the embodiment, the example of using the register 43 has been described. However, the invention is not limited to the example. For example, as illustrated in FIG. 8, the register 43 may not be used. FIG. 8 is a block diagram illustrating the configuration of the semiconductor device 10. In FIG. 8, the second counter circuit is different from that in the semiconductor device 10 described with reference to FIGS. 1 to 7. Only a different part will be described here.

In FIG. 4, the second counter circuit 24 has the register 43. In contrast, in FIG. 8, a second counter circuit 24A does not have the register 43. In place of the register 43, a nonvolatile memory provided in the storing circuit 13 is used as the register 43. In FIG. 8, nonvolatile memories used as the register 43 are expressed as 43A and 43B.

Since the operation is the same except that the count value obtained by the counter 44 is electrically written in the nonvolatile memory 43A or 43B in place of the register 43 and the comparison circuit 45 compares the count value written in the nonvolatile memory 43A or 43B with the counter 44, the description will not be given.

What is claimed is:

1. A semiconductor device comprising:
   a first counter; and
   a time measuring circuit measuring time until a count value, which is obtained by counting a first signal having a frequency corresponding to a first voltage, reaches a largest count value which can be counted by the first counter,
   wherein the first counter obtains a piece of digital information corresponding to the first voltage on the basis of a count value obtained by counting a second signal having a frequency corresponding to a second voltage, which is different from the first voltage, on the basis of the time measured by the time measuring circuit.

2. The semiconductor device according to claim 1, further comprising a voltage generating circuit generating the first and second voltages,
   wherein the voltage generating circuit generates, as the second voltage, a voltage whose temperature dependence is lower than that of the first voltage.

3. The semiconductor device according to claim 2, further comprising a voltage-to-frequency converting circuit,
   wherein the voltage-to-frequency converting circuit converts the first and second voltages to the first and second signals, respectively, in a time division manner.

4. The semiconductor device according to claim 3, wherein the time measuring circuit comprises:
   a second counter counting a third signal having a predetermined frequency; and
   a register storing a count value of the second counter when the count value of the first counter reaches a largest count value which can be counted by the first counter, and
   wherein the time measuring circuit compares a value stored in the register with the count value of the second counter when the first counter counts the second signal and, when the values match, stops counting by the first counter.

5. The semiconductor device according to claim 4, wherein the largest count value which can be counted by the first counter is equal to or smaller than the largest count value which can be counted by the second counter.

6. The semiconductor device according to claim 4, wherein the register is a nonvolatile memory.

* * * * *